United States Patent [19]

Ghoshal

[11] Patent Number: 4,689,505
[45] Date of Patent: Aug. 25, 1987

[54] HIGH SPEED BOOTSTRAPPED CMOS DRIVER

[75] Inventor: Uttam S. Ghoshal, Austin, Tex.

[73] Assignee: Microelectronics and Computer Technology Corporation, Austin, Tex.

[21] Appl. No.: 930,165

[22] Filed: Nov. 13, 1986

[51] Int. Cl.[4] .................. H03K 17/06; H03K 19/096
[52] U.S. Cl. .................................. 307/482; 307/451; 307/578; 307/270
[58] Field of Search ............... 307/443, 448, 451, 475, 307/482, 577, 578–579, 584–585, 270

[56] References Cited

U.S. PATENT DOCUMENTS

| | | | |
|---|---|---|---|
| 3,898,479 | 8/1975 | Proebsting | 307/482 |
| 4,289,973 | 9/1981 | Eaton, Jr. | 307/451 |
| 4,379,974 | 4/1983 | Plachno | 307/578 X |
| 4,388,538 | 6/1983 | Ikeda | 307/482 |
| 4,408,136 | 10/1983 | Kirsch | 307/475 |
| 4,431,927 | 2/1984 | Eaton, Jr. et al. | 307/578 X |
| 4,542,307 | 9/1985 | Baba | 307/443 X |
| 4,542,310 | 9/1985 | Ellis et al. | 307/578 |
| 4,570,244 | 2/1986 | Sud et al. | 307/482 X |
| 4,611,134 | 9/1986 | Ando | 307/482 |

OTHER PUBLICATIONS

Koomen et al, "A MOST Inverter With Improved Switching Speed", IEEE JSSC, vol. SC-7, No. 3, Jun. 1972, pp. 231–237.
Knepper, "Dynamic Depletion Mode: An E/D MOSFET Circuit Method for Improved Performance", IEEE JSSC, vol. SC-13, No. 5, Oct. 1978, pp. 542–548.
Long et al, "Dynamic Logic Driver", IBM T.D.B., vol. 17, No. 7, Dec. 1974, pp. 1989–1990 (307/432).

Primary Examiner—Stanley D. Miller
Assistant Examiner—D. R. Hudspeth
Attorney, Agent, or Firm—Fulbright & Jaworski

[57] ABSTRACT

A bootstrapped CMOS driver circuit capable of driving large capacitance loads with small internal delays. Higher driving capability is achieved by using only n-channel transistors at the output and overdriving the transistors during the transitions. A total internal delay of less than one nanosecond for a driver may be provided with 100 ohms compatible output impedance.

3 Claims, 1 Drawing Figure

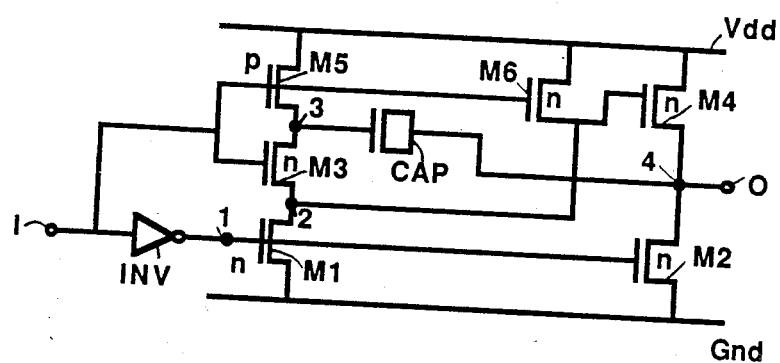
Figure 1. Driver circuit

HIGH SPEED BOOTSTRAPPED CMOS DRIVER

BACKGROUND OF THE INVENTION

Complementary Metal Oxide Semiconductors (CMOS) technology, having n-channel and p-channel enhancement mode devices fabricated compatibly on a silicon chip and connected into push-pull complementary digital circuits has now become the dominant candidate for very large scale integrated (VLSI) circuits. These circuits offer low quiescent power dissipation and can be used in high areal density on a chip. However, it is desirable to decrease the internal delay and provide higher speeds.

The present invention is directed to an improved CMOS driver circuit having a small internal delay for large loads. The present invention is directed to a bootstrapped driver circuit that provides with a typical 1.25 um technology, a total internal delay of less than 1 nanosecond for a driver with 100 ohms compatible output impedance. Furthermore, if complementary signal outputs are available, the internal delay will be even less. The circuit is highly suitable for low temperature operating circuits, clock buffers and high-speed digital applications involving high impedance transmission lines.

SUMMARY

The present invention is directed to a bootstrapped CMOS driver circuit using only n-channel transistors at the output and overdriving the transistors during the transitions.

A still further object of the present invention is the provision of a CMOS driver circuit having a capacitor which is charged to a high level when the input signal to the circuit is low, and when the input signal to the circuit is high using the charge on the capacitor to increase the speed of switching.

Yet a still further object of the present invention is the provision of a high speed CMOS driver circuit having a plurality of transistors having a source, gate and drain nodes. The gate nodes of a first, second, third, fifth and sixth transistor are connected to an input, the drain nodes of the fifth transistor, the sixth transistor and the fourth transistor are connected to a drain supply voltage, and the source nodes of the first and second transistors are connected to ground. A capacitor has one side connected to the source node of the fifth transistor and the drain node of the third transistor, and the other side is connected to an output. The source node of the fourth transistor and the drain node of the second transistor are connected to the output. The gate of the fourth transistor and the source node of the third transistor and the drain node of the first transistor are connected to the source node of the sixth transistor. The first, second, third, fourth and sixth transistors are n-channel transistors and the fifth transistor is a p-channel transistor. The capacitor is charged to a high level when the input signal is low, and this charge is used when the input signal is high to assist in bootstrapping the actuation of the fourth transistor and causing the fourth transistor to be overdriven.

Other and further objects, features and advantages will be apparent from the following description of a presently preferred embodiment of the invention, given for the purpose of disclosure and taken in conjunction with the accompanying drawing.

BRIEF DESCRIPTION OF THE DRAWING

FIG. 1 is a schematic of the CMOS driver circuit of the present invention.

DESCRIPTION OF THE PREFERRED EMBODIMENT

Referring now to the drawing, a CMOS driver circuit is shown.

A plurality of transistors are provided, each having a source, gate and drain nodes. Thus, a first n-channel transistor M1, a second n-channel transistor M2, a third n-channel transistor M3, a fourth n-channel transistor M4, a fifth p-channel transistor M5, and a sixth n-channel transistor M6 are provided. A circuit input I is provided which is connected to the gate node of the first transistor M1 and the gate node of the second transistor M2 through an inverter INV. In addition the input I is connected to the gate node of the third transistor M3, the fifth transistor M5, and the sixth transistor M6. The drain nodes of the fifth transistor M5, the sixth transistor M6 and the fourth transistor M4 are connected to a drain supply voltage Vdd. The source nodes of the first transistor M1 and the second transistor M2 are connected to ground.

A capacitor CAP has one side connected to the point 3 at the source node of the fifth transistor M5 and the drain node of the third transistor M3. The other side of the capacitor CAP is connected to an output O. The source node of the fourth transistor M4 and the drain node of the second transistor M2 are connected at 4 to the output O. The source node of the third transistor M3 and the drain node of the first transistor M1 are connected to a point 2 which is connected to the source node of the sixth transistor M6 and the gate node of transistor M4.

When the input I is low, transistors M1, M2, M5 are ON and the transistors M3, M6, M4 are OFF. The capacitor CAP has its node 3 charged to a high level and the output node O is at a low level. When the input I goes high, M1, M2, M5 are OFF and transistors M3, M6 and M4 are ON. The node 2 is charged high, because of M6 being ON and because of some charge sharing of the charge on the capacitor CAP through transistor M3. Because the capacitor CAP was already charged when the input I was low, less time is required for the node 2 to reach the (Vdd-Vt) level where Vt is the threshold level. When this occurs, transistor M6 turns OFF. Concurrently the output node O is driven to a high level by transistor M4. As the output level rises, the transistor M4 is overdriven and the node 2 is bootstrapped because the voltage across the capacitor CAP remains constant. Using 1.25 um technology, the total internal delay of the driver circuit is about 1.2 ns for a driver with 100 ohms output impedance. If complementary signal inputs are available, the internal delay will be less.

The lengths of the interconnects between transistor M1 and M2 and between transistor M3 and M4 can be adjusted for delay skew so that the short circuit current at the output stage through transistor M4 and M2 can be minimized. This results in smaller current spikes.

At low temperatures, charge retention of the capacitor CAP is better (charge decay constant tends to infinity), latchup immunity is improved and hence the performance is still better. For 100 ohm transmission lines, the present driver provides a match termination with internal delays less than 1 ns.

The present invention, therefore, is well adapted to carry out the objects and attain the ends and advantages mentioned as well as others inherent therein. While a presently preferred embodiment of the invention has been given for the purpose of disclosure, numerous changes in the details of construction, and arrangement of parts, will be readily apparent to those skilled in the art, and which are encompassed within the spirit of the invention and scope of the appended claims

What is claimed is:

1. A high speed CMOS driver circuit comprising,
   a plurality of transistors having source, gate and drain nodes,
   the gate nodes of a first, second, third, fifth and sixth transistor coupled to an input,
   the drain nodes of the fifth transistor, the sixth transistor and a fourth transistor being connected to a drain supply voltage,
   the source nodes of the first and second transistors being connected to ground,
   a capacitor one side of which is connected to the source node of the fifth transistor and the drain node of the third transistor and the other side connected to an output,
   the source node of the fourth transistor and the drain node of the second transistor connected to the output,
   the source node of the third transistor and the drain node of the first transistor and the gate node of the fourth transistor connected to the source node of the sixth transistor.

2. The circuit of claim 1 wherein,
   the second and fourth transistors are n-channel transistors.

3. The circuit of claim 2 wherein the first and third transistors are n-channel transistors and the fifth transistor is a p-channel transistor.

* * * * *